(12) United States Patent
Khan et al.

(10) Patent No.: US 10,853,104 B2
(45) Date of Patent: Dec. 1, 2020

(54) VIRTUAL ENVIRONMENT FOR SIMULATING A REAL-WORLD ENVIRONMENT WITH A LARGE NUMBER OF VIRTUAL AND REAL CONNECTED DEVICES

(71) Applicant: Plasma Business Intelligence, Inc., Dallas, TX (US)

(72) Inventors: Yasser Khan, Dallas, TX (US); Mahesh Ramu, Dallas, TX (US)

(73) Assignee: Plasma Business Intelligence, Inc., Dallas, TX (US)

( * ) Notice: Subject to any disclaimer, the term of this patent is extended or adjusted under 35 U.S.C. 154(b) by 771 days.

(21) Appl. No.: 14/976,883

(22) Filed: Dec. 21, 2015

(65) Prior Publication Data

US 2016/0253190 A1   Sep. 1, 2016

Related U.S. Application Data

(60) Provisional application No. 62/126,202, filed on Feb. 27, 2015.

(51) Int. Cl.
*G06F 9/455* (2018.01)
*G06F 30/13* (2020.01)
(Continued)

(52) U.S. Cl.
CPC .............. *G06F 9/455* (2013.01); *G06F 30/13* (2020.01); *G06F 30/20* (2020.01); *G06F 30/3312* (2020.01)

(58) Field of Classification Search
CPC .. G06F 9/455; G06F 17/5004; G06F 17/5031; G06F 30/20; G06F 30/25;
(Continued)

(56) References Cited

U.S. PATENT DOCUMENTS 6,113,395 A * 9/2000 Hon ..................... G09B 23/28
434/262
6,236,908 B1 * 5/2001 Cheng ................ F02D 41/0062
701/1
(Continued)

FOREIGN PATENT DOCUMENTS

CN   103399495 A   11/2013
CN   103605532 A    2/2014

OTHER PUBLICATIONS

Gubbi et al. ("Internet of Things (IoT): A Vision, Architectural Elements, and Future Directions", The University of Melbourne, 2012, pp. 1-19) (Year: 2012).*

(Continued)

*Primary Examiner* — Iftekhar A Khan
(74) *Attorney, Agent, or Firm* — Vinson & Elkins L.L.P.

(57) ABSTRACT

A computer implemented method and system for generating a hybrid test construct, and for simulating and recording events, to test and simulate a virtual environment of connected devices. A plurality of real devices and virtual devices are provided and their behavior parameters are provided. A hybrid test construct of virtual and real devices is created by connecting the plurality of real devices and instantiating the virtual devices and external influencers. At least one container is specified to represent the virtual environment. A spatial relationship of the real devices, the virtual devices, and the external influencers are specified. Then at least one event is specified. A simulation is run where real data is received from the real devices that are then combined with a behavioral simulation of the virtual devices and external influencers. The results of the simulation are then compared to forecasted behavior.

16 Claims, 5 Drawing Sheets

(51) Int. Cl.
*G06F 30/20* (2020.01)
*G06F 30/3312* (2020.01)

(58) Field of Classification Search
CPC ...... G06F 30/27; G06F 30/28; G06F 2111/00; G06F 2119/22
USPC .......................................................... 703/17
See application file for complete search history.

(56) References Cited

U.S. PATENT DOCUMENTS

| | | | |
|---|---|---|---|
| 6,697,879 B1 | 2/2004 | Tufty et al. | |
| 7,031,900 B1* | 4/2006 | Vakada | G06F 30/33 703/17 |
| 7,050,958 B1* | 5/2006 | Bortfeld | G06F 30/33 703/15 |
| 7,557,775 B2* | 7/2009 | Gross | G06F 3/011 345/633 |
| 7,590,853 B1* | 9/2009 | Shear | G06F 21/10 705/57 |
| 8,015,335 B2* | 9/2011 | Farrell | G06F 9/30003 710/104 |
| 8,364,457 B2* | 1/2013 | Moon | H04W 16/22 703/13 |
| 8,819,320 B2* | 8/2014 | Farrell | G06F 9/30003 710/104 |
| 9,078,299 B2* | 7/2015 | Ashdown | H05B 47/00 |
| 9,826,045 B2* | 11/2017 | Straub | H04L 67/34 |
| 2005/0053008 A1* | 3/2005 | Griesing | H04L 43/50 370/241 |
| 2006/0136653 A1* | 6/2006 | Traut | G06F 9/4406 711/6 |
| 2007/0097832 A1* | 5/2007 | Koivisto | A63H 30/04 369/63 |
| 2007/0265721 A1* | 11/2007 | Coburn | G05B 19/4185 700/97 |
| 2009/0065596 A1* | 3/2009 | Seem | F24F 11/30 236/51 |
| 2009/0089700 A1* | 4/2009 | Gu | G05B 19/41885 715/771 |
| 2009/0094575 A1* | 4/2009 | Vieira | G06F 8/10 717/104 |
| 2010/0302143 A1* | 12/2010 | Spivack | G06F 3/1454 345/157 |
| 2010/0304804 A1* | 12/2010 | Spivack | G06N 3/006 463/2 |
| 2011/0066412 A1* | 3/2011 | Van Doorn | G06N 3/006 703/3 |
| 2011/0077892 A1* | 3/2011 | Emami | H04L 67/12 702/113 |
| 2011/0142321 A1* | 6/2011 | Huffman | G06F 19/321 382/131 |
| 2012/0030646 A1* | 2/2012 | Ravindran | G06F 8/20 717/105 |
| 2013/0187930 A1* | 7/2013 | Millman | G06T 19/00 345/473 |
| 2013/0189658 A1* | 7/2013 | Peters | G09B 19/24 434/234 |
| 2013/0218542 A1* | 8/2013 | Yerli | G06F 30/20 703/6 |
| 2013/0297764 A1* | 11/2013 | Patel | H04L 12/4625 709/223 |
| 2014/0040855 A1* | 2/2014 | Wang | G06F 9/4494 717/107 |
| 2014/0052421 A1 | 2/2014 | Allen et al. | |
| 2014/0065584 A1 | 3/2014 | Wallace et al. | |
| 2014/0095122 A1* | 4/2014 | Appleman | G06T 19/003 703/1 |
| 2014/0136667 A1* | 5/2014 | Gonsalves | G06F 11/3664 709/221 |
| 2014/0176607 A1* | 6/2014 | Yang | G06F 3/011 345/633 |
| 2014/0324909 A1* | 10/2014 | Brown | G06F 16/2465 707/778 |
| 2014/0337673 A1* | 11/2014 | Busi | G06F 11/3684 714/38.1 |
| 2015/0028998 A1* | 1/2015 | Billig | H04L 12/2818 340/9.1 |
| 2015/0058838 A1* | 2/2015 | Tsirkin | G06F 9/45558 718/1 |
| 2015/0157944 A1 | 6/2015 | Gottlieb | |
| 2015/0212920 A1* | 7/2015 | Kraus | G06F 11/3466 717/127 |
| 2015/0378931 A1* | 12/2015 | White | G06F 3/06 711/6 |
| 2016/0055573 A1* | 2/2016 | Chen | G06Q 30/0641 705/26.41 |
| 2016/0069919 A1* | 3/2016 | Holmes | G01N 21/07 506/2 |
| 2016/0259870 A1* | 9/2016 | Greenspan | G06F 30/20 |
| 2016/0283352 A1* | 9/2016 | Kraus | G06F 3/0482 |
| 2016/0306900 A1* | 10/2016 | Himmler | G05B 11/01 |
| 2017/0357427 A1* | 12/2017 | Wilson | G06F 3/0487 |
| 2018/0001184 A1* | 1/2018 | Tran | H04N 5/2257 |
| 2018/0067633 A1* | 3/2018 | Wilson | G06F 3/0482 |
| 2018/0252428 A1* | 9/2018 | Malcolm | F24F 11/46 |

OTHER PUBLICATIONS

Hadjiski et al. ("HVAC Control via Hybrid Intelligent Systems", Bulgarian Academy of Sciences, 2007, pp. 77-94) (Year: 2007).*
Roberto Minerva ("From Internet of Things to the Virtual Continuum: an architectural view", Telecom Italia, 2014, pp. 1-6) (Year: 2014).*
Mishra et al. ("Enhancing Enterprise Virtual Worlds with Real-World Event Information", IEEE, 2011, pp. 1-4) (Year: 2011).*
Hu, Xiaolin; Zeigler, Bernard P., A Simulation-Based Virtual Environment to Study Cooperative Robotic Systems, pp. 1-28, Georgia State University, Atlanta, GA, USA; University of Arizona, Tucson AZ, USA.

* cited by examiner

VIRTUAL ENVIRONMENT FOR SIMULATING A REAL-WORLD ENVIRONMENT WITH A LARGE NUMBER OF VIRTUAL AND REAL CONNECTED DEVICES

CROSS REFERENCE TO RELATED APPLICATIONS

This application claims priority under 35 U.S.C. § 119(e) to provisional patent application Ser. No. 62/126,202 filed Feb. 27, 2015, the disclosure of which is hereby incorporated by reference in its entirety.

BACKGROUND

The world we live in is now a world of connected devices and sensors wirelessly communicating with each other. Prompted by a revolution that was the mobile phone followed by smart phones, the number of connected devices and sensors in our surrounding environment has proliferated at a rapid pace. Sensors, electronic devices, computing devices, and other connected entities have become ubiquitous in the modern world, along with the widespread availability of telecommunication infrastructure. Never before have so many connected entities been available for use. The number of such entities are increasing at an extremely fast pace. Deployment of multitudes of such connected entities in specific environments, such as buildings, airports, and homes etc. are becoming common.

One major problem that has arisen with the deployment of such an environment of connected entities is the ability to manage and predict how a large number of connected entities can operate together with each other. For example, in a commercial setting, a building manager of a 20-floor office building faces a major problem in understanding how the placement of 500 temperature sensors placed throughout the building to feed data to the central climate control system will operate together. Furthermore, the building manager has to consider the 1000 motion sensors controlling light fixtures that are already installed and are also feeding data to the central climate control system. This scenario is additionally complicated where the occupants of the building are present in the building. An analysis of how the 500 temperature sensors will interact with the existing 1000 motion sensors controlling the light fixtures and the presence of occupants in the building cannot therefore be done in a vacuum. Traditionally, the only way to conduct an accurate analysis is to bear the entire cost of installing all 500 temperature sensors before their interaction can be understood.

To address this problem of managing and predicting how an environment containing a large number of connected devices and sensors interact together, solutions have emerged that provide for the ability to create a virtual environment of connected devices, sensors and sensed objects on a computer. These solutions allow a user to simulate how devices and sensors interact with each other as well as with how they respond to external stimuli. Information relevant to attempts to address this problem can be found in U.S. Pat. No. 6,236,908 ("Cheng et al."), U.S. Pat. No. 8,306,801 ("Nunez"), U.S. Pat. No. 8,364,457 ("Moon"), U.S. Pat. No. 9,078,299 ("Ashdown"), U.S. Patent Application Nos. 2009/0089700 ("Gu et al."), 2011/0066412 ("Van Doom et al."), and Chinese Patent Nos. CN103399495A, CN103605532A. However each one of these references fails to provide features such as: (1) the ability to test real devices and virtual devices simultaneously together using real data from the real devices, (2) the ability to account for a large number of real devices and virtual devices and their spatial relationship with each other, (3) the ability to easily construct new virtual environments across multiple different simulations, (4) the ability to run simulations using accelerated or decelerated time-lapse modes, and (5) the ability to account for the influence of external influencers on the simulation.

For the foregoing reasons, there is a need for a virtual environment that can be used to simulate a real-world environment with a large number of real devices and virtual devices and how they respond to external stimuli so as to verify the accuracy of forecasted behavior.

SUMMARY

The present disclosure relates to a computer implemented method or system directed to satisfying the need for a hybrid test construct to test a virtual environment comprising a large number of connected virtual and real devices. A database containing a library of devices and sensors is enumerated. A plurality of real devices are then connected to a hybrid test construct. Behavior parameters of the plurality of real devices are configured using an element configuration tool. A plurality of virtual sensors are then instantiated in the hybrid test construct by selecting from the library of devices and entities. Behavior parameters associated with the plurality of real devices and virtual devices are configured. The behavior parameter may include what data is sent, the frequency of sending the data, change of frequency and change of data during the event. External influencers, such as sensed objects, are also instantiated in the hybrid test construct. A container is defined that represents a universe of the virtual environment. The spatial relationship of the plurality of virtual sensors in relation to the container and to each other are specified. Then a database is configured to specify at least one event by associating the plurality of virtual devices, the external influencers, and the container with the event. External influencers to the event are also specified.

In a preferred embodiment, the spatial relationship of the plurality of virtual devices, the plurality of real devices, and the plurality of sensed objects within the container can be specified using a four-dimensional coordinate system or a five-dimensional coordinate system. Multiple containers can be specified within the universal container. A hierarchy can be specified between the multiple containers. The spatial relationship of the real devices, virtual devices and external influencers can be continuously updated so their movement within the virtual environment can be tracked and monitored.

In order to simulate the hybrid construct, external stimuli known as external influencers can be configured to affect specific behavior parameters. Additionally, the external influencers can be configured to affect specific real devices, virtual devices or containers instantiated within the hybrid test construct. The virtual sensors are also able to receive external data.

Pre-defined templates of the hybrid test construct of virtual and real devices can be stored as template building blocks to facilitate construction of new hybrid test constructs. The template building blocks can be the real devices connected, the virtual devices instantiated, the container specified, the event defined, and the external influencers instantiated in the hybrid test construct. A template creation tool is provided to allow a user to access a previously saved template building block to create new pre-defined templates.

Once defined, the hybrid test construct is simulated. An event for simulation is selected for application to the generated hybrid test construct. A time and repetition for the event selected for simulation can be defined. Data from the real devices connected are received into the hybrid test construct. The processor begins to generate a behavioral simulation of the virtual devices instantiated. This behavioral simulation is then combined with the data from the connected real devices to generate a simulation of the entire environment of connected devices, sensors and sensed objects. Additionally, an overlap, lead or lag between multiple events in a simulation can be specified After the simulation is complete, the results of the simulation can be compared to a forecasted behavior to verify the accuracy of the forecast. The results of the simulation can also be stored for play-back. The simulation can be played-back on a time-lapse mode different from the time-lapse mode on which the stored simulated virtual environment of connected devices was generated. The time lapse mode can be a true time-lapse, an accelerated time-lapse, or a decelerated time-lapse.

The novel features and construction of the present invention, as well as additional objects thereof, will be understood more fully from the following description when read in connection with the accompanying drawings.

BRIEF DESCRIPTION OF THE DRAWINGS

These and other features, aspects, and advantages of the present disclosure will become better understood with regard to the following description, appended claims, and accompanying drawings where:

DESCRIPTION OF THE PREFERRED EMBODIMENTS

Figure 1A:
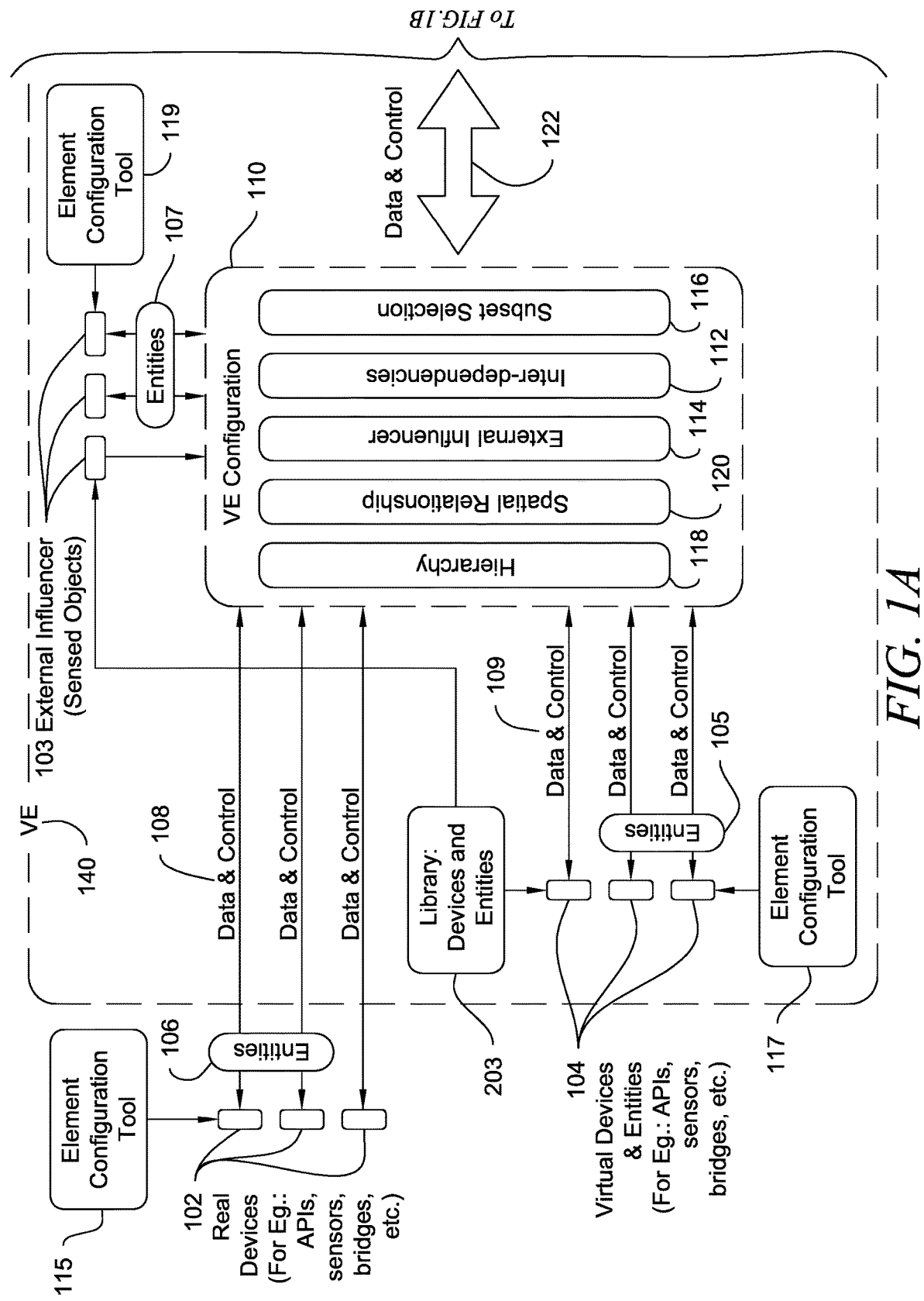
FIG. 1A is a diagrammatic illustration of a first portion of an architecture of a virtual environment in a preferred embodiment.

The present invention can be better understood by the following discussion of the manufacture and use of certain preferred embodiments. Like reference numerals are used to describe like parts in all figures of the drawings.

Figure 3:
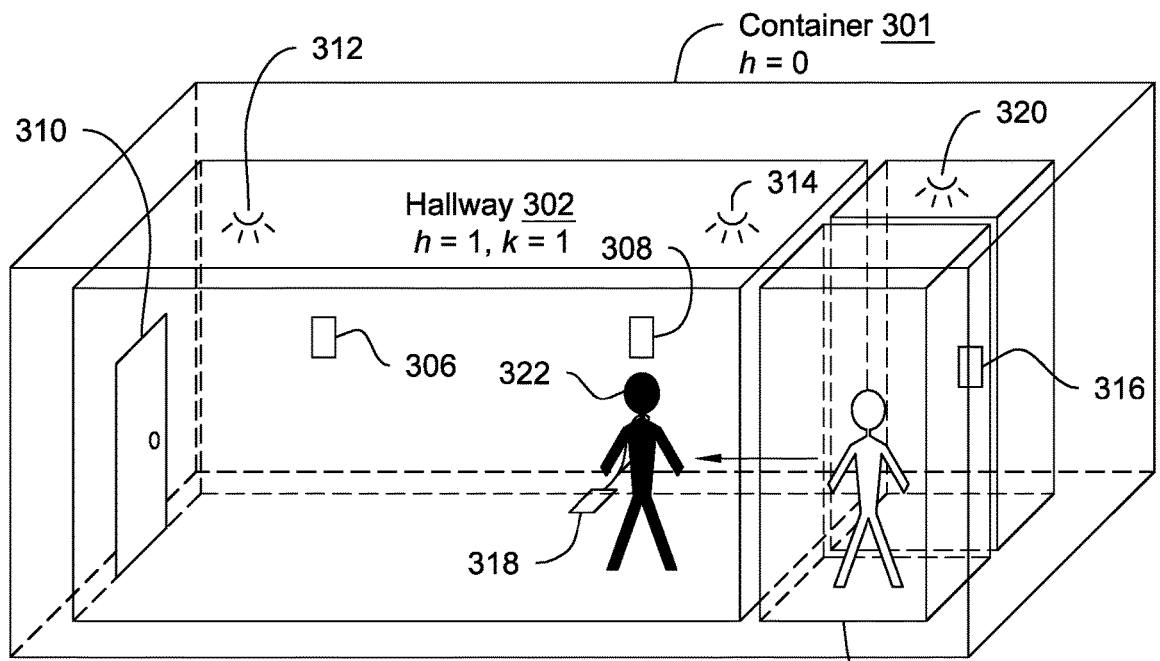
FIG. 3 is an illustration of the virtual environment of the preferred embodiment simulating an exemplary real world environment containing real devices, virtual devices and sensed objects.

An example of a situation where the virtual environment of the current invention is useful is shown in FIG. 3. In this example, the real world environment includes a hallway 302 with a door 310 at one end and an elevator 304 at the other end. The hallway has two lights that contain motion sensors 312 and 314 in them. Another light with a motion sensor 320 is present in the elevator. These motions sensors 312, 314 and 320 embedded in the lights, can turn on or off the lights when an external influencer (occupant 322) is detected. When the sensors 312, 314, and 320 in the lights detect an occupant 322 in the hallway or elevator respectively, it can also send a signal to the HVAC system to request the heating or cooling to be adjusted if necessary to a desired level for the occupied space. When occupant 322 is no longer detected by the motion sensors 312, 314, and 320, a separate signal is sent to the HVAC system to indicate that the desired heating or cooling level for an occupied space is no longer required.

A building manager may consider adding temperature sensors 306, 308 and 316 to the hallway and the elevator that will also send signals to the HVAC system to adjust the heating and cooling. The various sensors may not only end up sending conflicting signals under certain circumstances, but may send signals at different intervals. For example, the motion sensors 312, 314 and 320 may send a signal every 30 seconds to the HVAC system while the temperature sensors may only send a signal every 5 minutes. The building manager is designing a system to include the new temperature sensors. After designing the system, the building manager may generate a forecasted behavior for the new system. It would be desirable to be able to simulate the effect of installing these new sensors along with the existing sensors and be able to test the interaction of the various sensors based upon various environmental factors and/or sensed objects in the environment to verify their forecasted behavior.

Figure 1B:
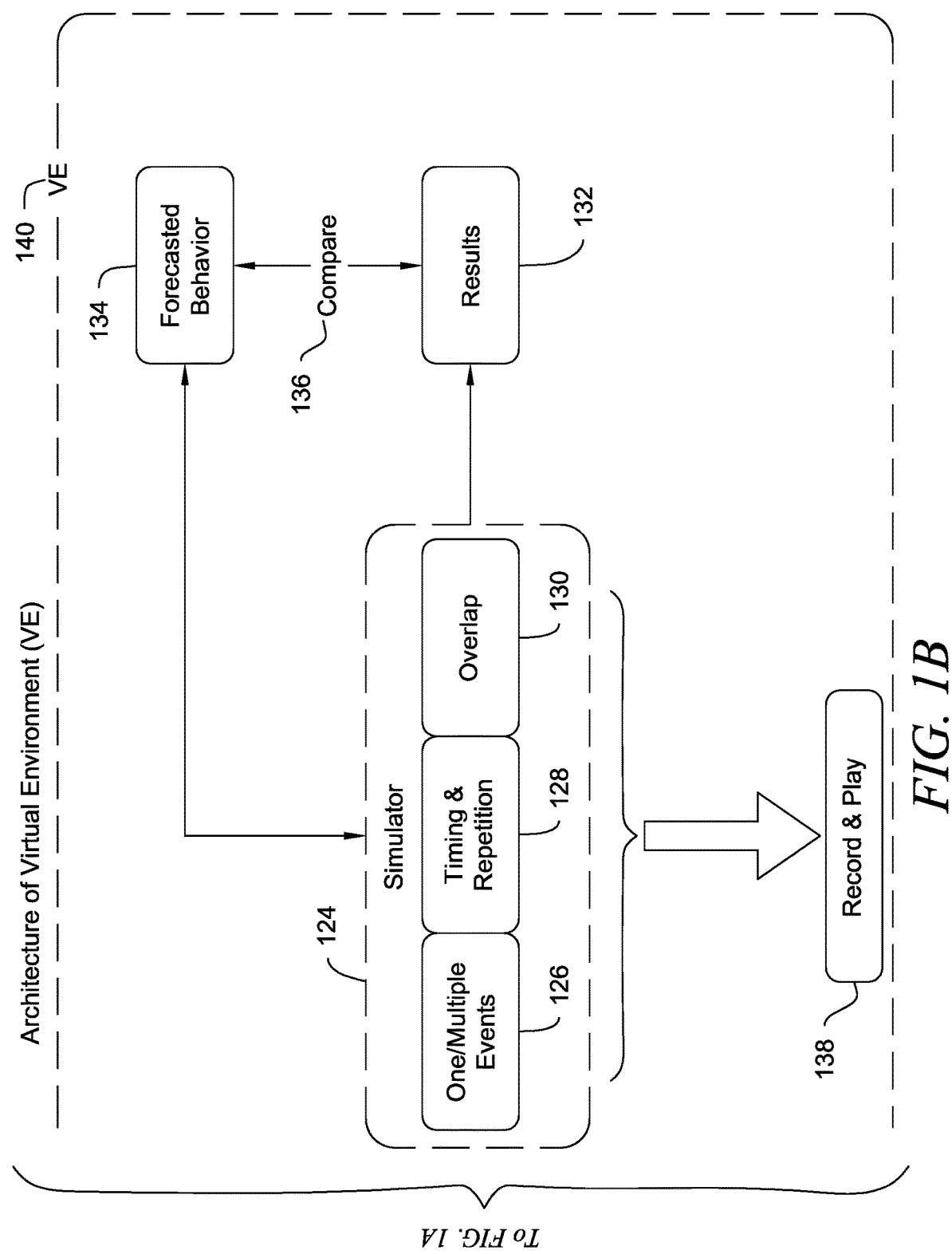
FIG. 1B is a diagrammatic illustration of a second portion of an architecture of the virtual environment depicted in FIG. 1.

FIGS. 1A and 1B collectively is a diagrammatic illustration of an architecture of a virtual environment 140 in a preferred embodiment. The virtual environment 140 may be a representation of any real world environment such as a building, a hospital, an airport, a train station, a section of roadway, or an uncontained outdoor environment, such as a park. These real world environments can be configured as containers in the virtual environment.

As shown more particularly in FIG. 1A and FIG. 1B, the architecture of the virtual environment 140 in the preferred embodiment provides for virtual environment configuration 110, a library of devices and entities 203, virtual devices 104 and virtual entities 105, a simulator 124, a record and play-back module 138, a results analysis module 132, and a forecasted behavior module 134. The architecture of the virtual environment 140 also provides for virtual devices 104. Virtual devices 104 can simulate, but are not limited to, devices such as temperature sensors, barometric sensors, humidity sensors, air-quality sensors, and motion detectors. The virtual device 104 can simulate individual stand-alone devices or sensors, or a device or sensor embedded within a virtual entity 105. The virtual entity 105 can simulate, but is not limited to, a smartphone, a laptop computer, a wearable watch, or appliances or fixtures such as lights. Each virtual entity 105 can contain one or more different individual virtual devices 104. The virtual devices 104 and virtual entities 105 are connected within the virtual environment 140 to the virtual environment configuration 110 and exchange data and control information 209. Data and control information 109 is exchanged continuously between the virtual devices 104 and the virtual entities 105 connected to the virtual environment configuration 110. For example in the scenario shown in FIG. 3 the virtual devices can simulate the temperature sensors temperature sensors 306, 308 and 316.

The external influencers 103, can be configured to affect specific behavior parameters. The external influencers 103 can also be configured to affect specific virtual devices, or containers within the virtual environment 140. Each external influencer is defined by assigning it a specific name. External influencers 103 may be assigned one or more properties from a set of associated properties that include, but are not limited to size, weight, position, motion, speed, smell temperature, and brightness. Another property that can be associated with an external influencer 103 is the ability for it to pass through a specific container material. The effect on the external influencer 103 from passing through the material can be specified. For example, in the scenario of FIG. 3, if a first container (the hallway 302) is filled with air and a second container (the elevator 304) is filled with water, when an external influencer passes from the first container to the second container, the effect on the external influencer 103 can be expressed as a difference in the speed property, of the external influencer, expressed as a delta of the speed.

Sensed objects are a type of external influencer 103. Sensed objects are objects that real devices 102 and virtual devices 104 interact with. Sensed objects may also be embedded within entities 107. Furthermore, the entities 107 may themselves be entities that contain devices that conduct sensing operations. However, in this aspect of the operation of the embodiment they are the targets of the sensing operations conducted by the real devices 102 and the virtual devices 104. The sensed objects can include, but are not limited to, passive RFID badges, occupants, or any other object that can be sensed by one of the real or virtual devices.

External to the architecture of the virtual environment 140 are real devices 102 and real entities 106. The real devices 206 can similarly be, but are not limited to, devices such as temperature sensors, barometric sensors, humidity sensors, air-quality sensors, motion detectors. The major distinction between the real devices and virtual devices are that the real devices 102 are devices that already physically exist in the real-world environment that are simulated. The virtual devices 104 exist only in the virtual environment 140 that is generated to facilitate the simulation. The real devices 102, similarly, can be embedded within real entities 106. Each real entity 106 can contain one or more real devices 102. Real devices 102 and real entities 106 are connected to the virtual environment configuration 110 of the virtual environment 140. When a device to be simulated in the virtual environment is a device, it will be simulated as a virtual device 104; if the device to be simulated is one embedded in an entity, it will be simulated as a virtual entity 105. Data and control information 108 can be exchanged continuously between the real devices 102 and real entities 106 connected to the virtual environment configuration 110.

The virtual environment configuration 110 within the architecture defines and contains databases to store important configurations for the virtual environment such as a hierarchy database 118, a spatial relationships database 120, an external influencers database 114, an inter-dependencies database 112, and a subset selection database 116. The hierarchy database 118 defines how real devices 102, real entities 106, virtual devices 104, virtual entities 105, and external influencers 103 relate to one or more containers, such as container 401 shown in FIG. 4. The hierarchy database 118 stores the containers as they are defined to represent the real world environment that is simulated. The spatial relationships database 120 stores the spatial position of real devices 102, real entities 106, virtual devices 104, virtual entities 105, external influencers 103 and entities 107 as they relate to the containers in which they are placed within.

The inter-dependencies database 112 stores information as to the relationship between events. For example in the scenario of FIG. 3, there is a first event 204a that is an elevator arrives at the floor and a second event 204b that is the elevator door opening. The inter-dependencies database is used to store information as to whether the second event 204a depends on the first event 204b.

Finally the subset selection database 116 specifies which portions of the virtual environment 140 are being simulated. The virtual environment configuration 110 feeds data and control information 122 to the simulator 124. For example in the scenario of FIG. 2 and FIG. 3, the user can specify whether both a first container (the hallway 302) and a second container (the elevator 304) are simulated or only one container is simulated. The external influencers database 114 stores defined external influencers. For example in the scenario of FIG. 3, the external influencers represent an occupant 322 and an RFID badge 318 worn by the occupant. The external influencers database 114 stores the properties associated with the occupant 322 and the RFID badge 318 worn by the occupant.

The simulator 124 provides the virtual environment with the ability to generate a behavioral simulation of real devices 102, real entities 106, virtual devices 104, virtual entities 105, external influencers 103 and external influencers embedded within entities 107. The simulator 124 provides for a one/multiple events module 126, a timing and repetition module 128, and an overlap module 130. These three modules permit the user to further define how the simulation is performed including specifying whether one or multiple events influence the virtual environment, the timing of the events, and whether the events overlap or depend on one another for timing.

Figure 2:
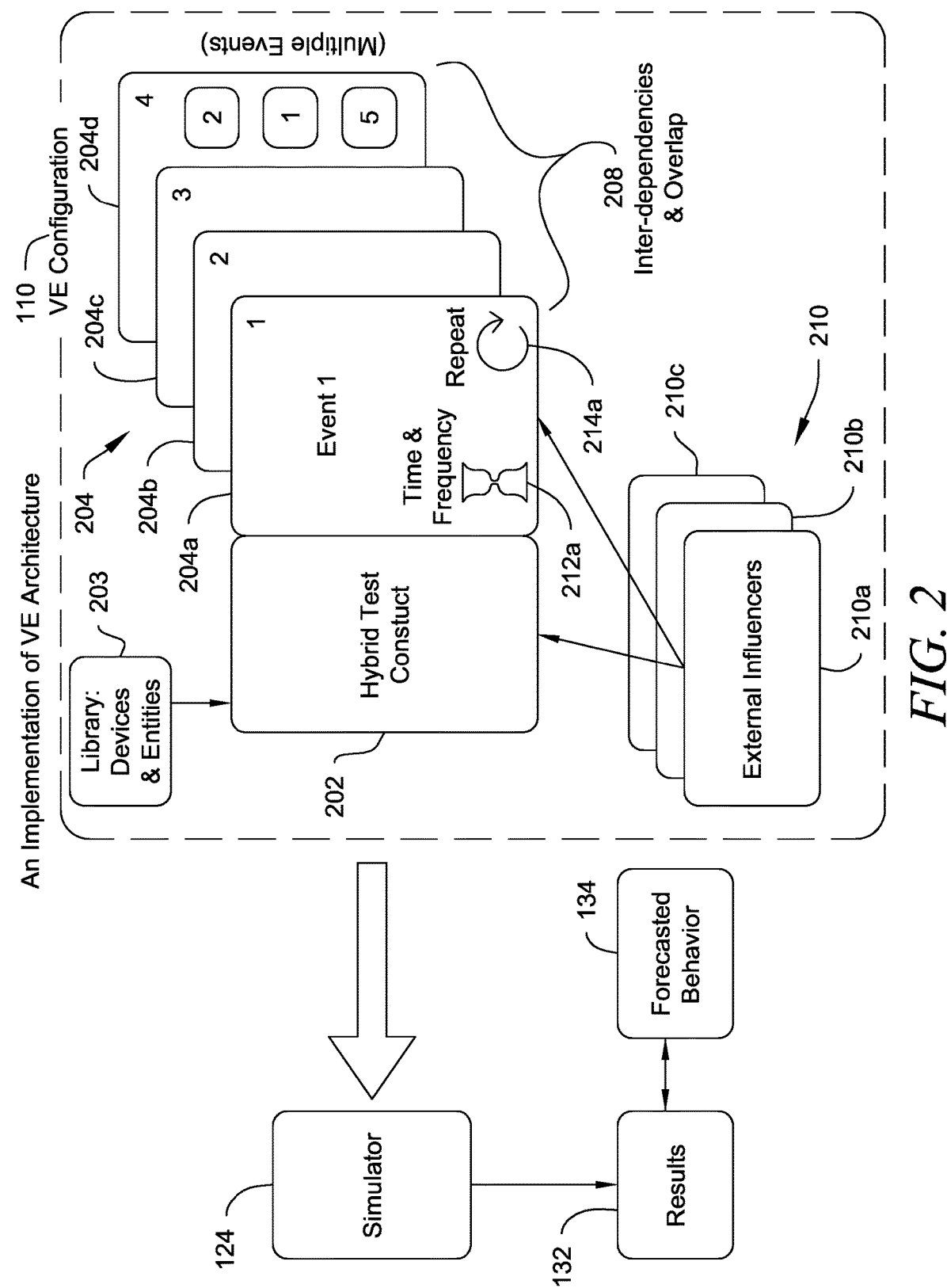
FIG. 2 is an illustration an implementation of one preferred embodiment of the virtual environment.

FIG. 2 is an illustration of one preferred embodiment of the architecture of the virtual environment when implemented. More specifically, in the virtual environment configuration 110 during implementation, which is the generation of a hybrid construct and the generation of a simulation of the virtual environment, various different functionalities are featured. The hierarchy database 118, the spatial relationships database 120, the external influencers database 114, the inter-dependencies database 112, and the subset selection database 116 of the virtual environment configuration 110 as shown in FIG. 1A remain active in the background.

A hybrid test construct 202 of the virtual environment is first generated. The hybrid test construct 202 is a model in which the real devices and external influencers are connected, the virtual devices have been instantiated, and containers are specified so processing of the simulation can begin. The hybrid test construct 202 is generated by connecting the real devices 102 or real entities 106, instantiating virtual devices 104 or virtual entities 105, and then instantiating-external influencers 103 (such as sensed objects or sensed entities). The hybrid test construct is further defined by specifying at least a first container 401 and defining a hierarchy within that first container 22. Then at least one of a plurality of events 204 is specified for application to the hybrid test construct by relating external influencers 210 comprising at least a first external influencer 210a to the real devices 202, real entities 206, virtual devices 204, virtual entities 205 that are within the hybrid test construct 302. The external influencers 310 can include a first external influencer 310a, a second external influencer 310b, and a third external influencer 310c.

The real devices 102 and real entities 106 found in the real-world environment are first connected to the hybrid test construct 202. These connections can be made by linking with each of the real devices 102 and real entities 106. The behavior parameters of the real devices 102 and real entities 106 can then be configured using an element configuration tool 115. The element configuration tool 115 is used with real devices 102 and real entities 106 includes a hardware module and a software module. The element configuration tool 115 is able to configure the behavior of the real world sensors by communicating with the real devices 102 and set behavior parameters as allowed by the specific real devices 102. For example, in one scenario, a real device 102 is a temperature sensor. The element configuration tool 115 may be used to set a temperature threshold so that the temperature sensor only reports temperatures above 102 degrees Fahrenheit.

Next, the virtual devices 104 and virtual entities 105 are instantiated. This is done by selecting the virtual devices 104 and virtual entities 105 from the library of devices and entities 203 containing pre-defined devices and entities. The behavior parameters of the virtual devices 104 and virtual entities 105 can be configured using an element configuration tool 117. The element configuration tool 117 is used to set the behavior parameters of the virtual devices 104 and virtual entities 105. The element configuration tool 117 is a software module that allows virtual devices 104 to be configured. For example, in one scenario, a virtual device 104 is a simulation of a temperature sensor in the real-world environment. The element configuration tool 117 may be used to set a temperature threshold so that the temperature sensor only reports temperatures above 102 degrees Fahrenheit. External influencers 103 and entities 107 are similarly instantiated.

In order to clarify the spatial relationships between the real devices 102, real entities 106, virtual devices 104, virtual entities 105, sensed objects 103, or sensed entities 107 within the hybrid test construct 202, a system of containers with hierarchies is defined. The devices' and entities' basic spatial position within each container is specified by three-dimensional coordinates as associated with the x, y and z axes. However, to increase the efficiency of generating real-world environments having a large number of devices and entities, containers can be placed within other containers. The relationship between containers within other containers are specified as hierarchy levels.

Furthermore, specified containers can be stored as template building blocks within the hierarchy database 118. Template building blocks can be loaded from the hierarchy database 118 when generating a new hybrid test construct 202. By allowing containers to be placed within other containers, part or all of a hybrid test construct 202 can be generated by loading containers previously defined and stored as template building blocks within the hierarchy database 118. The complexity and redundancy in creating a hybrid test construct 202 to simulate a large number of connected devices and entities each time is thereby reduced.

With a hybrid test construct defined, at least one of the plurality of events 204 is defined to apply to the hybrid test construct 202. As shown in FIG. 2, in this preferred embodiment, the one/multiple events module 126 is used to define events 204 comprising a first event 204a, a second event 204b, a third event 204c and a fourth event 204d. Either one, several, or all four events can be specified to apply to the hybrid test construct 202. For example the timing and repetition module 128, then defines the timing for each event. Whether each event 204 repeats can also be defined. Finally, the overlap module 130 allows the user to specify if events 204 occur completely independently or with some overlap in time. The overlap module 130 also allows the user to specify if the events 204 occur with some time lag. For example, specifying an overlap would mean a second event 204b can be specified to begin when a first event 204a is three-quarters complete. Specifying a lag would mean that the second event 204b is specified to begin one hour after the first event 204a is complete.

Figure 4:
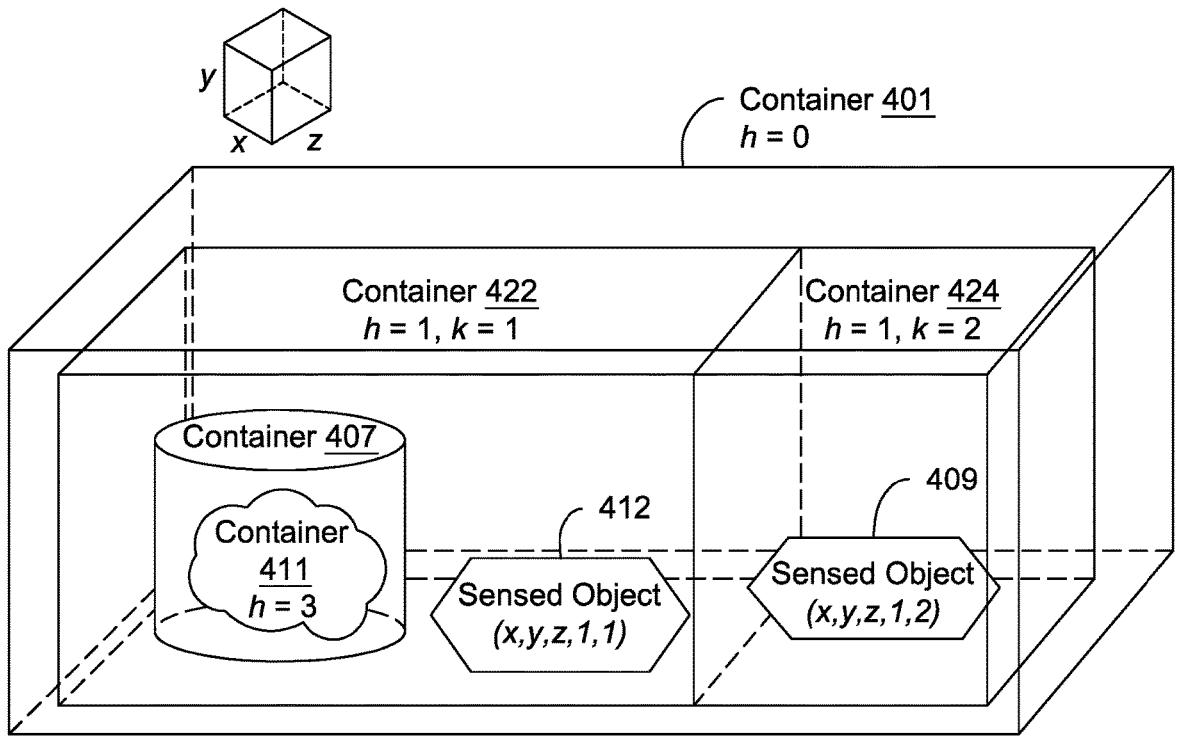
FIG. 4 is an illustration of the four-dimensional and five-dimensional coordinate system used to specify the spatial relationships and hierarchy of real devices, virtual devices, and sensed objects within a container in the virtual environment.

FIG. 4 is an illustration of the four-dimensional and five-dimensional coordinate systems used to specify the spatial relationships and hierarchy of real devices, virtual devices, and external influencers within containers in the virtual environment. As used herein, container refers to a bounded receptacle in which devices, external influencers, and other containers can be placed. In one embodiment, the spatial data is stored in the form of a four dimensional coordinate system (x, y, z, h) where x, y and z represent coordinates in three-dimensional space referenced to the immediate container in which a device or external influencer is positioned and a fourth coordinate h represents the hierarchy of the container as it relates to other containers in the virtual environment. As shown in FIG. 4, the virtual environment is a first container 401, which serves as a universal container meaning that there is no other container outside this container. A second container 422 and a third container 424 are placed within the first container 401. A fourth container 407 is placed within the second container 422. A fifth container 411 is placed within the fourth container 407. A device located within the second container 422 but not within the fourth container 407 has a hierarchy level of 1, i.e., h=1. A device located within the fourth container 407, but not within the fifth container 411 is defined with hierarchy level of 2, i.e., h=2. Devices placed within the fifth container 411 are defined with the hierarchy level of 3, i.e., h=3. The second container 422 itself is defined with hierarchy level of 1, i.e., h=1. A first sensed object 412 located within the second container 422 is defined with h=1 and has its spatial data represented in the four-dimensional coordinate system with the values (x, y, z, 1), where x, y, z are referenced to the first container 22. The first container 401 is defined with the hierarchy level of 1, i.e., h=1.

As shown in FIG. 4, adjacent to the second container 422 is a third container 424. Found within the third container 424 is a second sensed object 409, which can be defined by a fifth dimension k, which can be understood as common-level container coordinate. When the sensed object 412 with five dimensional coordinate (x, y, z, 1, 1) moves from the second container 422 to the third container 424, its coordinates changes to (x, y, z, 1, 2). This enables tracking of external influencers that are not stationary and are mobile within the virtual environment between different common-level containers during the simulation of the virtual environment.

Figure 5:
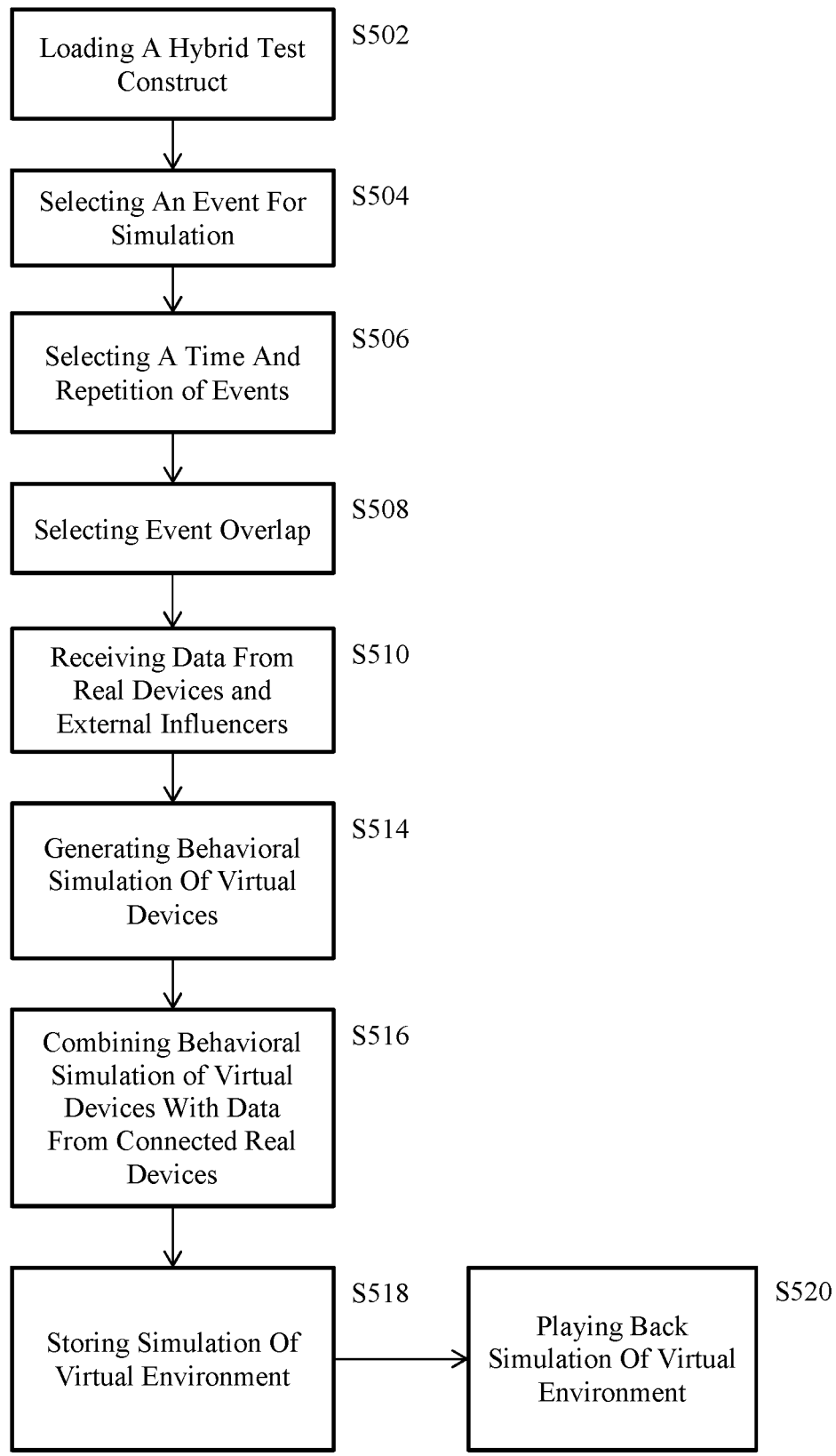
FIG. 5 is a process flow chart of generating a simulation of the virtual environment and storing and playing-back the simulation.

FIG. 5 is a process flow chart of generating a simulation of the virtual environment and storing and playing-back the simulation. In a preferred embodiment, with the hybrid test construct 202 generated, the simulator 124 can then generate simulations of the virtual environment. The simulator loads a previously generated hybrid test construct 202 in step S502. At least one event 204 for simulation is selected from previously defined events associated with the hybrid test construct 202 using the one/multiple events module 126. External influencers 210 specified to act on different devices and entities are also activated based on their association to an event 204. In step S506, the time and the repetition of the events for simulation are selected. In step S508, the extent to which multiple events overlap are defined if multiple events 204 associated with the hybrid test construction 202 have been selected for simulation. This setting is controlled by the overlap module 130. In step S510, real data from real devices 102 and real entities 106 are received into the hybrid test construct 202.

The simulator 124 begins to generate a behavioral simulation for the virtual devices 104 and virtual entities 105, based on previously defined behavior parameters for each of these devices in step S514. In step S516, the generated behavioral simulation of the virtual devices 104 and virtual entities 105 are combined with data from the connected real devices being received into the hybrid test construct 202.

Upon completion of the simulation of the virtual environment performed in step S516, the record and play module 138 allows storage of the simulation as seen in step S518. The simulation of the virtual environment can be played-back in step S520. The play back of the simulation of the virtual environment can be performed at different time-lapse modes. More specifically, the play back can be performed at an accelerated time-lapse mode or a decelerated time-lapse mode.

As discussed above, FIG. 3 is an illustration of the virtual environment simulating an exemplary real world environment containing real devices and virtual devices. In this exemplary example, the scenario is a hallway 302 connecting an elevator 304 to a door 310 that leads to another room (not shown). The hallway 302 and elevator 304 are specified with h=1 within the universe container 301, which has h=0. The hallway contains motion sensors 312 and 314 installed within light fixtures. The elevator contains a motion sensor 320 installed within a light fixture. A building manager wishes to generate a hybrid test construct 202 to simulate the effect of installing new temperature sensors in the hallway and in the elevator. A hybrid test construct is generated specifying the motion sensors 312, 314 and 320 as real devices 102. Temperature sensors 306, 308, and 316 are selected from a library of devices and entities 203 and instantiated within the hybrid test construct 202 as virtual devices 104. An occupant 322 of the building or a RFID badge 318 carried by the occupant 322 are specified as external influencers in the form of sensed objects 103. The motion sensor 314 in the hallway 302 is defined with the device behavior parameter frequency of data sent as 100 times per minute.

The spatial relationships of all the real devices, virtual devices and external influencers within the container are defined using a five-dimensional coordinate system. For example the motion sensors 312 and 314 have the coordinates (x, y, z, 1, 1) where x, y and z are values that are referenced to the hallway 302. The motion sensor 320 in the elevator 304 has the coordinates (x, y, z, 1, 2) where x, y, and z are values that are referenced to the elevator 304.

The hybrid test construct 202 within the virtual environment configuration 110 is specified by associating events 204 with the hybrid test construct 202. The first event 204a is a power blackout and the second event 204b is an earthquake. The time 212a and frequency 214a for the first event 204a are specified as five minutes and one time at 12 noon respectively. The time 212b and frequency 214b (not shown in FIG. 2) of the second event 204b (not shown in FIG. 2) is specified as one minute and one time at 3 p.m. respectively. An external influencer 210a that is a shortage of power to circuit on which the motion sensor 220 in the elevator 304 is specified. The external influencer 210a is specified to affect the motion sensor 314 and specifically reduces the frequency of data sent to 50 times per minute during the event 204a.

With the hybrid test construct 202 generated, a simulation of the virtual environment that is the elevator and the hallway is ready to be executed. The hybrid test construct 202 that is the hallway and elevator containing the connected real motion sensors and instantiated virtual temperature sensors is accessed. The event 204a previously associated with the hybrid test construct 202 is selected. The simulation is run for a duration of one day and one 24 hour day. At exactly 12 noon the event 204a, a blackout, occurs for five minutes for one time. During the five minute duration of the event 204a, the frequency of data sent by the motion sensor is reduced to 50 times per minute. The effect of the reduction in the frequency of data sent by the motion sensor 314 on its ability to detect an RFID badge 318 carried by an occupant 322, as well as detecting the occupant 322 himself walking in the hallway 302 is simulated. The results of the simulation of the virtual environment are stored and made available for play-back. In playing-back the simulation of the virtual environment, the play-back can be done in the accelerate time-lapse mode so the play-back is completed in half a day.

Other alterations and modifications of the invention will likewise become apparent to those of ordinary skill in the art upon reading the present disclosure, and it is intended that the scope of the disclosure made herein be limited only by the broadest interpretation of the appended claims to which the inventor is legally entitled.

Unless otherwise specifically stated, the terms and expressions have been used herein as terms of description and not terms of limitation. There is no intention to use the terms or expressions to exclude any equivalent of features shown and described or portions thereof and this invention should be defined in accordance with the claims that follow.

What is claimed is:

1. A computer-implemented system for generating a hybrid test construct to test and simulate a virtual environment of connected devices, the system comprising:
   at least one processor configured to perform operations to:
   provide a plurality of real devices, wherein each real device has at least one behavior parameter;
   provide a plurality of virtual devices, wherein each virtual device has at least one behavior parameter;
   create a hybrid test construct of virtual and real devices;
   connect the plurality of real devices to the hybrid test construct;
   provide a library of devices and entities;
   instantiate the plurality of virtual devices in the hybrid test construct of virtual and real devices by selecting the plurality of virtual devices from the library of devices and entities;
   configure the at least one behavior parameter associated with the plurality of real devices and configuring the at least one behavior parameter associated with the plurality of virtual devices using an element configuration tool;
   instantiate at least one external influencer in the hybrid test construct of virtual and real devices, wherein each of the at least one external influencer has at least one property;
   configure the at least one property of the at least one external influencer;
   specify at least one container, wherein the at least one container represents a universe of the virtual environment;
   specify a spatial relationship of each of the plurality of real devices, each of the plurality of virtual devices, and each of the at least one external influencer in relation to the container;

specify at least one event by associating the plurality of virtual devices, the plurality of real devices, the at least one external influencer, and the container with the event;

store the hybrid test construct of virtual and real devices as a template building block, wherein the template building block includes the plurality of real devices connected, the plurality of virtual devices instantiated, the at least one external influencer instantiated, the container specified, and the event defined in the hybrid test construct of virtual and real devices; and provide a template creation tool to access the template building block to create a pre-defined template, wherein the pre-defined template is a previously saved template building block comprising a plurality of previously saved real devices connected, a plurality of previously saved virtual devices instantiated, a plurality of previously saved containers, a previously saved event, and a plurality of previously saved external influencers instantiated.

2. The system of claim 1, wherein the at least one behavior parameter includes what data is sent, frequency of sending data, change of frequency and change of data during the event.

3. The system of claim 1, further comprising the at least one processor configured to perform operations to specify a hierarchy that can be defined by at least one of the plurality of real devices, at least one of the plurality of virtual devices, the at least one external influencer, or at least one the containers, or a combination of devices and containers.

4. The system of claim 1, wherein the spatial relationship of the plurality of real devices, the plurality of virtual devices, the at least one external influencer, and the container is defined using a four-dimensional coordinate system, wherein the four-dimensional coordinate system represents the locations of the plurality of real devices, the plurality of virtual devices, and the at least one external influencer in the container within the virtual environment.

5. The system of claim 1, wherein the spatial relationship of the plurality of real devices, the plurality of virtual devices, the at least one external influencer, and the container is defined using a five-dimensional coordinate system, wherein the five-dimensional coordinate system represents the locations of the plurality of real devices, the plurality of virtual devices, and the at least one external influencer in the container within the virtual environment.

6. The system of claim 1, wherein the spatial relationship of the plurality of real devices, the plurality of virtual devices, the at least one external influencer, and the container is continuously updated.

7. The system of claim 1, wherein the at least one external influencer is configured to affect a specific one of the plurality of virtual devices, or containers.

8. The system of claim 1, further comprising the at least one processor configured to perform operations to specify at least a second container within the container and defining a hierarchy between the containers.

9. A computer implemented method for generating a hybrid test construct to test and simulate a virtual environment of connected devices, the method comprising:

providing a plurality of real devices, wherein each real device has at least one behavior parameter;

providing a plurality of virtual devices, wherein each virtual device has at least one behavior parameter;

creating a hybrid test construct of virtual and real devices;

connecting the plurality of real devices to the hybrid test construct;

providing a library of devices and entities;

instantiating the plurality of virtual devices in the hybrid test construct of virtual and real devices by selecting the plurality of virtual devices from the library of devices and entities;

configuring the at least one behavior parameter associated with the plurality of real devices and configuring the at least one behavior parameter associated with the plurality of virtual devices using an element configuration tool;

instantiating at least one external influencer in the hybrid test construct of virtual and real devices, wherein each of the at least one external influencer has at least one property;

configuring at least one property of the at least one external influencer;

specifying at least one container, wherein the at least one container represents a universe of the virtual environment;

specifying a spatial relationship of each of the plurality of real devices, each of the plurality of virtual devices, and each of the at least one external influencer in relation to the container;

specifying at least one event by associating the plurality of virtual devices, the plurality of real devices, the at least one external influencer, and the container with the event;

storing the hybrid test construct of the plurality of virtual devices as a template building block, wherein the template building blocks includes the plurality of virtual devices instantiated, the at least one external influencer instantiated, the container specified, and the event defined in the hybrid test construct of virtual and real devices; and providing a template creation tool to access the template building block to create a pre-defined template, wherein the pre-defined template is a previously saved template building block comprising a plurality of previously saved real devices connected, a plurality of previously saved virtual devices instantiated, a plurality of previously saved containers, a previously saved event, and a plurality of previously saved external influencers instantiated.

10. The method of claim 9, wherein the at least one behavior parameter includes what data is sent, frequency of sending data, change of frequency and change of data during the event.

11. The method of claim 9, further comprising specifying a hierarchy that can be defined by at least one plurality of real devices, at least one of the plurality of virtual devices, the at least one of the external influencer, or at least one of the containers, or a combination of devices, external influencers and containers.

12. The method of claim 9, wherein the spatial relationship of the plurality of real devices, the plurality of virtual devices, the at least one external influencer, and the container is defined using a four-dimensional coordinate system, wherein the four-dimensional coordinate system represents the locations of the plurality of real devices, the plurality of virtual devices, and the at least one external influencer in the container within the virtual environment.

13. The method of claim 9, wherein the spatial relationship of the plurality of real devices, the plurality of virtual devices, the at least one external influencer, and the container is defined using a five-dimensional coordinate system, wherein the five-dimensional coordinate system represents the locations of the plurality of real devices, the plurality of virtual devices, and the at least one external influencer in the container within the virtual environment.

14. The method of claim 9, wherein the spatial relationship of the plurality of real devices, the plurality of virtual devices, the at least one external influencer and the container is continuously updated.

15. The method of claim 9, wherein the at least one external influencer is configured to affect specific virtual devices or containers.

16. The method of claim 9, further comprising specifying at least a second container within the first container and defining a hierarchy between the containers.

* * * * *